US009449859B2

United States Patent
Song

(10) Patent No.: US 9,449,859 B2
(45) Date of Patent: Sep. 20, 2016

(54) MULTI-GAS CENTRALLY COOLED SHOWERHEAD DESIGN

(75) Inventor: Eddy J. Song, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 862 days.

(21) Appl. No.: 13/500,948

(22) PCT Filed: Oct. 8, 2010

(86) PCT No.: PCT/US2010/051961
§ 371 (c)(1),
(2), (4) Date: Oct. 23, 2012

(87) PCT Pub. No.: WO2011/044451
PCT Pub. Date: Apr. 14, 2011

(65) Prior Publication Data
US 2013/0052804 A1 Feb. 28, 2013

Related U.S. Application Data

(60) Provisional application No. 61/250,472, filed on Oct. 9, 2009.

(51) Int. Cl.
*C23C 16/455* (2006.01)
*H01L 21/67* (2006.01)
(Continued)

(52) U.S. Cl.
CPC ...... *H01L 21/67115* (2013.01); *C23C 16/4411* (2013.01); *C23C 16/455* (2013.01);
(Continued)

(58) Field of Classification Search
CPC ............... C23C 16/411; C23C 16/455; C23C 16/45514; C23C 16/45572; C23C 16/45574; C23C 16/45576

USPC ........... 118/715; 156/345.33–345.34, 345.37
See application file for complete search history.

(56) References Cited

U.S. PATENT DOCUMENTS 4,134,425 A * 1/1979 Gussefeld et al. ......... 137/625.3
4,590,042 A * 5/1986 Drage ...................... 422/186.06
(Continued)

FOREIGN PATENT DOCUMENTS

JP       01180982 A  *  7/1989  ............. C23C 16/50
JP       06151336 A  *  5/1994  ........... H01L 21/205
(Continued)

OTHER PUBLICATIONS

International Search Report, PCT/US2010/051961, May 27, 2011.

*Primary Examiner* — Rudy Zervigon
(74) *Attorney, Agent, or Firm* — Patterson & Sheridan, LLP

(57) ABSTRACT

A method and apparatus for chemical vapor deposition and/or hydride vapor phase epitaxial deposition are provided. The apparatus generally include a lower bottom plate and an upper bottom plate defining a first plenum. The upper bottom plate and a mid-plate positioned above the upper bottom plate define a heat exchanging channel. The mid-plate and a top plate positioned above the mid-plate define a second plenum. A plurality of gas conduits extend from the second plenum through the heat exchanging channel and the first plenum. The method generally includes flowing a first gas through a first plenum into a processing region, and flowing a second gas through a second plenum into a processing region. A heat exchanging fluid is introduced to a heat exchanging channel disposed between the first plenum and the second plenum. The first gas and the second gas are then reacted to form a film on a substrate.

12 Claims, 4 Drawing Sheets

(51) Int. Cl.
*C23C 16/44* (2006.01)
*C30B 25/14* (2006.01)
*C30B 29/40* (2006.01)
*H01L 21/02* (2006.01)

(52) U.S. Cl.
CPC ... *C23C16/45514* (2013.01); *C23C 16/45565* (2013.01); *C23C 16/45572* (2013.01); *C23C 16/45574* (2013.01); *C23C 16/45576* (2013.01); *C30B 25/14* (2013.01); *C30B 29/403* (2013.01); *H01L 21/0254* (2013.01); *H01L 21/0262* (2013.01)

(56) References Cited

U.S. PATENT DOCUMENTS

| | | | | |
|---|---|---|---|---|
| 4,612,077 A | * | 9/1986 | Tracy et al. | 156/345.34 |
| 4,854,263 A | * | 8/1989 | Chang et al. | 118/715 |
| 5,423,936 A | * | 6/1995 | Tomita et al. | 156/345.34 |
| 5,453,124 A | * | 9/1995 | Moslehi et al. | 118/715 |
| 5,480,678 A | * | 1/1996 | Rudolph et al. | 427/248.1 |
| 5,500,256 A | * | 3/1996 | Watabe | 427/579 |
| 5,558,819 A | * | 9/1996 | Den Hollander | 261/21 |
| 5,567,267 A | * | 10/1996 | Kazama et al. | 156/345.27 |
| 5,595,606 A | * | 1/1997 | Fujikawa et al. | 118/725 |
| 5,616,208 A | * | 4/1997 | Lee | 156/345.24 |
| 5,647,911 A | * | 7/1997 | Vanell et al. | 118/715 |
| 5,685,914 A | * | 11/1997 | Hills et al. | 118/723 E |
| 5,728,223 A | * | 3/1998 | Murakami et al. | 118/715 |
| 5,746,875 A | * | 5/1998 | Maydan et al. | 156/345.34 |
| 5,766,364 A | * | 6/1998 | Ishida et al. | 118/725 |
| 5,871,586 A | * | 2/1999 | Crawley et al. | 118/715 |
| 5,888,907 A | * | 3/1999 | Tomoyasu et al. | 438/714 |
| 5,935,337 A | * | 8/1999 | Takeuchi et al. | 118/724 |
| 5,950,925 A | * | 9/1999 | Fukunaga et al. | 239/132.3 |
| 5,976,261 A | * | 11/1999 | Moslehi et al. | 118/719 |
| 5,997,649 A | * | 12/1999 | Hillman | 118/715 |
| 6,086,677 A | * | 7/2000 | Umotoy et al. | 118/715 |
| 6,089,472 A | * | 7/2000 | Carter | 239/422 |
| 6,110,287 A | * | 8/2000 | Arai et al. | 156/345.34 |
| 6,110,556 A | * | 8/2000 | Bang et al. | 428/64.1 |
| 6,123,775 A | * | 9/2000 | Hao et al. | 118/724 |
| 6,197,121 B1 | * | 3/2001 | Gurary et al. | 118/725 |
| 6,206,972 B1 | * | 3/2001 | Dunham | 118/715 |
| 6,245,192 B1 | * | 6/2001 | Dhindsa et al. | 156/345.34 |
| 6,286,454 B1 | * | 9/2001 | Hirayama et al. | 118/723 MW |
| 6,302,964 B1 | * | 10/2001 | Umotoy et al. | 118/715 |
| 6,364,954 B2 | * | 4/2002 | Umotoy et al. | 118/715 |
| 6,387,182 B1 | * | 5/2002 | Horie et al. | 118/244 |
| 6,415,736 B1 | * | 7/2002 | Hao et al. | 118/723 E |
| 6,432,831 B2 | * | 8/2002 | Dhindsa et al. | 438/710 |
| 6,435,428 B2 | * | 8/2002 | Kim et al. | 239/553 |
| 6,446,573 B2 | * | 9/2002 | Hirayama et al. | 118/723 MW |
| 6,461,435 B1 | * | 10/2002 | Littau et al. | 118/715 |
| 6,502,530 B1 | * | 1/2003 | Turlot et al. | 118/723 E |
| 6,638,392 B2 | * | 10/2003 | Yamamoto et al. | 156/345.41 |
| 6,800,139 B1 | * | 10/2004 | Shinriki et al. | 118/715 |
| 6,849,241 B2 | * | 2/2005 | Dauelsberg et al. | 423/328.2 |
| 7,196,283 B2 | * | 3/2007 | Buchberger et al. | 219/121.43 |
| 7,201,942 B2 | * | 4/2007 | Jurgensen et al. | 427/248.1 |
| 7,296,534 B2 | * | 11/2007 | Fink | 118/723 E |
| 7,479,303 B2 | * | 1/2009 | Byun | 427/248.1 |
| 7,628,931 B2 | * | 12/2009 | Saito et al. | 216/58 |
| 7,674,352 B2 | * | 3/2010 | Bour et al. | 156/345.34 |
| 7,743,730 B2 | * | 6/2010 | Kholodenko et al. | 118/723 E |
| 7,981,216 B2 | * | 7/2011 | Ishibashi et al. | 118/715 |
| 8,128,751 B2 | * | 3/2012 | Kasai et al. | 118/715 |
| 8,133,323 B2 | * | 3/2012 | Kakegawa | 118/724 |
| 8,178,444 B2 | * | 5/2012 | Koshimizu et al. | 438/719 |
| 8,308,865 B2 | * | 11/2012 | Kim et al. | 118/715 |
| 8,361,892 B2 | * | 1/2013 | Tam et al. | 438/507 |
| 8,419,854 B2 | * | 4/2013 | Hatanaka et al. | 118/715 |
| 8,551,890 B2 | * | 10/2013 | Goodlin et al. | 438/758 |
| 8,668,775 B2 | * | 3/2014 | Moshtagh et al. | 118/715 |
| 8,679,956 B2 | * | 3/2014 | Tam et al. | 438/507 |
| 8,764,902 B2 | * | 7/2014 | Suzuki et al. | 118/715 |
| 8,778,079 B2 | * | 7/2014 | Begarney et al. | 118/715 |
| 8,808,454 B2 | * | 8/2014 | Lee | 118/715 |
| 8,882,913 B2 | * | 11/2014 | Byun et al. | 118/715 |
| 2001/0010207 A1 | * | 8/2001 | Yamamoto et al. | 118/723 MW |
| 2001/0047760 A1 | * | 12/2001 | Moslehi | 118/723 I |
| 2002/0017243 A1 | * | 2/2002 | Pyo | 118/715 |
| 2002/0069968 A1 | * | 6/2002 | Keller et al. | 156/345.33 |
| 2002/0129769 A1 | * | 9/2002 | Kim et al. | 118/723 E |
| 2003/0047282 A1 | * | 3/2003 | Sago et al. | 156/345.34 |
| 2003/0054099 A1 | * | 3/2003 | Jurgensen et al. | 427/248.1 |
| 2003/0207033 A1 | * | 11/2003 | Yim et al. | 427/255.37 |
| 2004/0050326 A1 | * | 3/2004 | Thilderkvist et al. | 118/715 |
| 2004/0206305 A1 | * | 10/2004 | Choi et al. | 118/715 |
| 2005/0092248 A1 | * | 5/2005 | Lee et al. | 118/715 |
| 2006/0011298 A1 | | 1/2006 | Lim et al. | |
| 2006/0021574 A1 | * | 2/2006 | Armour et al. | 118/715 |
| 2006/0021703 A1 | * | 2/2006 | Umotoy et al. | 156/345.34 |
| 2006/0137820 A1 | * | 6/2006 | Lee et al. | 156/345.37 |
| 2006/0263522 A1 | * | 11/2006 | Byun | 427/248.1 |
| 2007/0137573 A1 | * | 6/2007 | Kholodenko et al. | 118/723 E |
| 2007/0272154 A1 | * | 11/2007 | Amikura et al. | 118/719 |
| 2008/0124463 A1 | * | 5/2008 | Bour et al. | 427/255.28 |
| 2009/0081878 A1 | * | 3/2009 | Dhindsa | 438/729 |
| 2009/0095221 A1 | | 4/2009 | Tam et al. | |
| 2009/0095222 A1 | * | 4/2009 | Tam et al. | 118/723 R |
| 2009/0098276 A1 | * | 4/2009 | Burrows et al. | 427/8 |
| 2009/0169744 A1 | * | 7/2009 | Byun et al. | 427/255.28 |
| 2009/0178615 A1 | * | 7/2009 | Kim et al. | 118/715 |
| 2009/0178616 A1 | * | 7/2009 | Byun | 118/715 |
| 2009/0211707 A1 | * | 8/2009 | Chao et al. | 156/345.34 |
| 2009/0266911 A1 | * | 10/2009 | Kim et al. | 239/265.11 |
| 2010/0003405 A1 | * | 1/2010 | Kappeler | 427/255.28 |
| 2010/0261340 A1 | * | 10/2010 | Nijhawan et al. | 438/478 |
| 2010/0263588 A1 | * | 10/2010 | Zhiyin | 117/98 |
| 2011/0023782 A1 | * | 2/2011 | Han | 118/724 |
| 2011/0048325 A1 | * | 3/2011 | Choi et al. | 118/712 |
| 2011/0052833 A1 | * | 3/2011 | Hanawa et al. | 427/534 |
| 2011/0186228 A1 | * | 8/2011 | Huang et al. | 156/345.34 |
| 2011/0198034 A1 | * | 8/2011 | Sun et al. | 156/345.34 |
| 2011/0253044 A1 | * | 10/2011 | Tam et al. | 118/666 |
| 2011/0256315 A1 | * | 10/2011 | Tam et al. | 427/255.28 |
| 2011/0256692 A1 | * | 10/2011 | Tam et al. | 438/478 |
| 2011/0308551 A1 | * | 12/2011 | Chung et al. | 134/22.1 |
| 2012/0000490 A1 | * | 1/2012 | Chung et al. | 134/22.12 |
| 2012/0024478 A1 | * | 2/2012 | Huang et al. | 156/345.34 |
| 2012/0052216 A1 | * | 3/2012 | Hanawa et al. | 427/582 |
| 2012/0064698 A1 | * | 3/2012 | Olgado | 438/478 |
| 2012/0067971 A1 | * | 3/2012 | Byun et al. | 239/106 |
| 2012/0097330 A1 | * | 4/2012 | Iyengar et al. | 156/345.34 |
| 2012/0222815 A1 | * | 9/2012 | Sabri et al. | 156/345.34 |
| 2012/0234945 A1 | * | 9/2012 | Olgado | 239/589 |
| 2013/0052804 A1 | * | 2/2013 | Song | 438/478 |
| 2013/0109159 A1 | * | 5/2013 | Carlson | 438/503 |
| 2013/0118405 A1 | * | 5/2013 | Ho et al. | 118/715 |
| 2013/0174783 A1 | * | 7/2013 | Suzuki et al. | 118/725 |
| 2013/0269612 A1 | * | 10/2013 | Cheng et al. | 118/724 |
| 2013/0298835 A1 | * | 11/2013 | Tam et al. | 118/728 |
| 2014/0027060 A1 | * | 1/2014 | Ranish et al. | 156/345.33 |
| 2014/0227881 A1 | * | 8/2014 | Lubomirsky et al. | 438/710 |
| 2014/0235069 A1 | * | 8/2014 | Breiling et al. | 438/778 |
| 2015/0007770 A1 | * | 1/2015 | Chandrasekharan et al. | 118/715 |
| 2015/0007771 A1 | * | 1/2015 | Silva et al. | 118/715 |

FOREIGN PATENT DOCUMENTS

| | | | | | |
|---|---|---|---|---|---|
| JP | 06163433 A | * | 6/1994 | | H01L 21/205 |
| JP | 06196443 A | * | 7/1994 | | H01L 21/302 |
| JP | 06252093 A | * | 9/1994 | | H01L 21/302 |
| JP | 06333850 A | * | 12/1994 | | H01L 21/205 |
| JP | 06338476 A | * | 12/1994 | | H01L 21/302 |
| JP | 07007001 A | * | 1/1995 | | H01L 21/3065 |
| JP | 07058101 A | * | 3/1995 | | H01L 21/316 |
| JP | 07094488 A | * | 4/1995 | | H01L 21/3065 |
| JP | 07094489 A | * | 4/1995 | | H01L 21/3065 |
| JP | 07142391 A | * | 6/1995 | | H01L 21/205 |
| JP | 08255758 A | * | 10/1996 | | H01L 21/205 |
| JP | 08291385 A | * | 11/1996 | | C23C 16/44 |

(56) References Cited

FOREIGN PATENT DOCUMENTS

| JP | 10162992 | A | * | 6/1998 |
| JP | 11111626 | A | * | 4/1999 |
| JP | 2000195800 | A | * | 7/2000 |
| JP | 2001049442 | A | * | 2/2001 |
| JP | 2004103630 | A | * | 4/2004 |
| JP | 2010238831 | A | * | 10/2010 |

* cited by examiner

MULTI-GAS CENTRALLY COOLED SHOWERHEAD DESIGN

BACKGROUND OF THE INVENTION

1. Field of the Invention

Embodiments of the present invention generally relate to methods and apparatus for chemical vapor deposition (CVD) on a substrate, and, in particular, to a showerhead design for use in metal organic chemical vapor deposition and/or hydride vapor phase epitaxy (HVPE).

2. Description of the Related Art

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride. It has been observed that short wavelength LEDs fabricated using gallium nitride can provide significantly greater efficiencies and longer operating lifetimes than short wavelength LEDs fabricated using non-nitride semiconducting materials, such as Group II-VI materials.

One method that has been used for depositing Group III-nitrides, such as gallium nitride, is metal organic chemical vapor deposition (MOCVD). This chemical vapor deposition method is generally performed in a reactor having a temperature controlled environment to assure the stability of a first process gas which contains at least one element from Group III, such as gallium. A second process gas, such as ammonia, provides the nitrogen needed to form a Group III-nitride. The two process gases are injected into a processing zone within the reactor where they mix and move towards a heated substrate in the processing zone. A carrier gas may be used to assist in the transport of the process gases towards the substrate. The precursors react at the surface of the heated substrate to form a Group III-nitride layer on the substrate surface. The quality of the film depends in part upon deposition uniformity which, in turn, depends upon uniform mixing of the precursors across the substrate.

Multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the market place.

Interaction of the process gases with the hot hardware components, which are often found in the processing zone of an LED or LD forming reactor, will generally cause the precursor to break-down and deposit on these hot surfaces. Typically, the hot reactor surfaces are formed by radiation from the heat sources used to heat the substrates. The deposition of the precursor materials on the hot surfaces can be especially problematic when it occurs in or on the precursor distribution components, such as the showerhead. Deposition on the precursor distribution components will affect the flow distribution uniformity over time. Therefore, there is a need for a gas distribution apparatus that prevents or reduces the likelihood that the MOCVD or HVPE precursors will be heated to a temperature that will cause them to break down and affect the performance of the gas distribution device.

Also, as the demand for LEDs, LDs, transistors, and integrated circuits increases, the efficiency of depositing high quality Group-III nitride films takes on greater importance. Therefore, there is a need for an improved deposition apparatus and process that can provide consistent film quality over larger substrates and larger deposition areas.

SUMMARY OF THE INVENTION

A method and apparatus that may be utilized for chemical vapor deposition and/or hydride vapor phase epitaxial deposition are provided. The apparatus generally include a lower bottom plate and an upper bottom plate defining a first plenum. The upper bottom plate and a mid-plate positioned above the upper bottom plate define a heat exchanging channel. The mid-plate and a top plate positioned above the mid-plate define a second plenum. A plurality of gas conduits extend from the second plenum through the heat exchanging channel and the first plenum. The method generally includes flowing a first gas through a first plenum into a processing region, and flowing a second gas through a second plenum into a processing region. A heat exchanging fluid is introduced to a heat exchanging channel disposed between the first plenum and the second plenum. The temperature of the first gas is greater than the temperature of the second gas when the first gas and the second gas enter the processing region. The first gas and the second gas are then reacted to form a film on a substrate.

One embodiment provides an apparatus comprising a lower bottom plate and an upper bottom plate positioned above the lower bottom plate. The upper bottom plate and the lower bottom plate define a first plenum. A mid-plate is positioned above the upper bottom plate. The mid-plate and the upper bottom plate define a heat exchanging channel for containing a heat exchanging fluid. A top plate is positioned above the mid-plate. The top plate and the mid-plate define a second plenum. A plurality of first gas conduits extend from the second plenum through the heat exchanging channel and the first plenum. Each of the plurality of first gas conduits are in fluid communication with the second plenum and a processing region of a processing chamber.

In another embodiment, an apparatus comprises a lower bottom plate and an upper bottom plate positioned above the lower bottom plate. The upper bottom plate and the lower bottom plate define a first plenum. A plurality of first gas conduits are in fluid communication with the first plenum and a processing region of a process chamber. A mid-plate is positioned above the upper bottom plate. The mid-plate and the upper bottom plate define a heat exchanging channel for containing a heat exchanging fluid. A top plate is positioned above the mid-plate. The top plate and the mid-plate define a second plenum. The showerhead apparatus also comprises a plurality of second gas conduits in fluid communication with the second plenum and the processing region. The plurality of second gas conduits extend through the first plenum and the heat exchanging channel. Each of the first gas conduits has a second gas conduit that is disposed within the boundary of the first gas conduit.

In another embodiment, a method comprises flowing a first gas through a first plenum of a showerhead apparatus and into a processing region of a chamber. A second gas is flown through a second plenum of the showerhead apparatus and into the processing region of the chamber. The second plenum is fluidly coupled to the processing region through a plurality of gas conduits. A heat exchanging fluid is introduced to a heat exchanging channel disposed between the first plenum and the second plenum. The plurality of gas conduits extend through the heat exchanging channel. The first gas and the second gas are reacted in the processing region to form a film on the substrate, and the temperature of the first gas is greater than the temperature of the second gas when the first gas and the second gas enter the processing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus that may be utilized for chemical vapor deposition and/or hydride vapor phase epitaxial deposition are provided. The apparatus generally include a lower bottom plate and an upper bottom plate defining a first plenum. The upper bottom plate and a mid-plate positioned above the upper bottom plate define a heat exchanging channel. The mid-plate and a top plate positioned above the mid-plate define a second plenum. A plurality of gas conduits extend from the second plenum through the heat exchanging channel and the first plenum. The method generally includes flowing a first gas through the first plenum into a processing region and flowing a second gas through the second plenum into a processing region. A heat exchanging fluid is introduced to a heat exchanging channel disposed between the first plenum and the second plenum. The temperature of the first gas is greater than the temperature of the second gas when the first gas and the second gas enter the processing region. The first gas and the second gas are then reacted to form a film on a substrate.

Systems and chambers that may be adapted to practice the present invention are described in U.S. patent application Ser. No. 11/404,516, filed on Apr. 14, 2006, and Ser. No. 11/429,022, filed May 5, 2005, both of which are incorporated by reference in their entireties. It is contemplated that other systems and chambers may also benefit from embodiments described herein.

Figure 1:
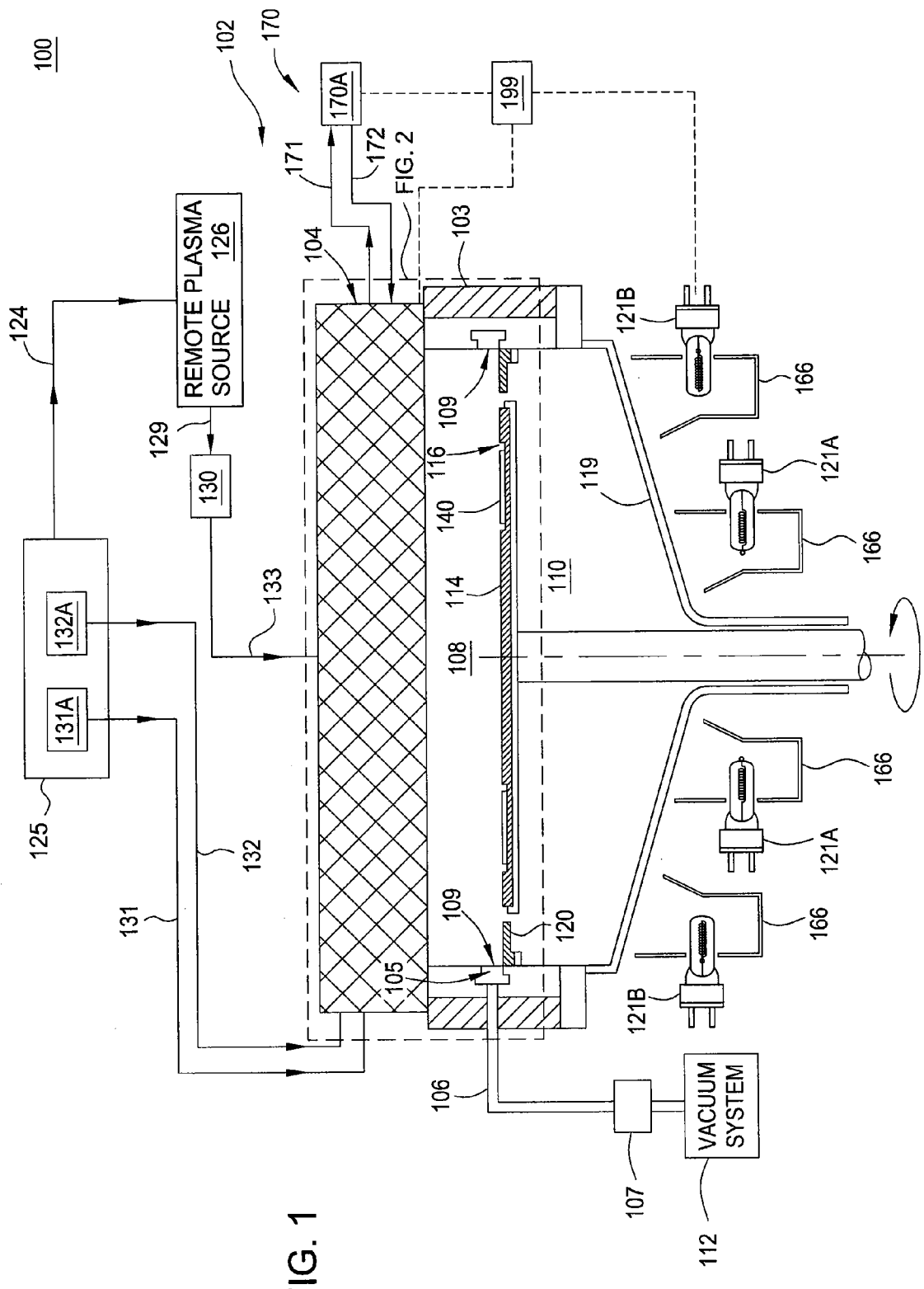
FIG. 1 is a schematic view of a deposition apparatus according to one embodiment of the invention.

FIG. 1 is a schematic view of a deposition apparatus according to one embodiment of the invention. The apparatus 100 includes a chamber 102, a gas delivery system 125, a remote plasma source 126, and a vacuum system 112. The chamber 102 includes a chamber body 103 that encloses a processing region 108 and a lower volume 110. A showerhead assembly 104 is disposed at one end of the chamber body 103, while a lower dome 119 is disposed at another end of the chamber body 103. A processing region 108 and a lower volume 110 are located between the showerhead assembly 104 and a lower dome 119 within the chamber body 103. A substrate carrier 114 is disposed between the processing region 108 and the lower volume 119. Thus, the lower volume 110 is defined by the lower dome 119 and the substrate carrier 114, while the processing region 108 is defined by the showerhead assembly 104 and the substrate carrier 114. The substrate carrier 114 is shown in the process position, but may be moved to a lower position where the substrates 140 may be loaded or unloaded. An exhaust ring 120 is disposed around the periphery of the substrate carrier 114 to help prevent deposition from occurring in the lower volume 110 and to also help direct exhaust gases from the chamber 102 to exhaust ports 109.

Radiant heating may be provided by a plurality of inner lamps 121A and outer lamps 121B disposed below the lower dome 119 to effect heating of substrates 140, substrate carrier 114, or process gases located within processing region 108. The lower dome 119 is made of transparent material, such as high-purity quartz, to allow light to pass therethrough from the plurality of inner lamps 121A and outer lamps 121B. Reflectors 166 may be used to direct the radiant energy provided by inner and outer lamps 121A, 121B to the interior volume of chamber 102. Additional rings of lamps may also be used for finer temperature control of the substrates 140.

The plurality of inner and outer lamps 121A, 121B may be arranged in concentric circles or zones (not shown), and each lamp zone may be separately powered. One or more temperature sensors, such as pyrometers (not shown), may be disposed within the showerhead assembly 104 to measure substrate 140 and substrate carrier 114 temperatures. The temperature data may be sent to a controller 199 which can adjust power to separate lamp zones to maintain a predetermined temperature profile across the substrate carrier 114. Additionally, the power to separate lamp zones can be adjusted to compensate for precursor flow or precursor concentration non-uniformity. For example, if the precursor concentration is lower in a substrate carrier 114 region near an outer lamp zone, the power to the outer lamp zone may be adjusted to help compensate for the precursor depletion in this region.

The inner and outer lamps 121A, 121B may heat the substrates 140 to a temperature of about 400 degrees Celsius to about 1200 degrees Celsius during processing. It is to be understood that the heating source is not restricted to the use of arrays of inner and outer lamps 121A, 121B. Any suitable heating source may be utilized to ensure that the proper temperature is adequately applied to the chamber 102 and substrates 140 therein. For example, the heating source may comprise resistive heating elements which are in thermal contact with the substrate carrier 114.

The substrate carrier 114 includes one or more recesses 116 within which one or more substrates 140 are disposed during processing. The substrate carrier 114 is formed from silicon carbide (SiC) and generally ranges in size from about 200 millimeters to about 750 millimeters. Alternatively, the substrate carrier 114 may be formed from SiC-coated graphite. The substrate carrier 114 can rotate about an axis during processing. For example, the substrate carrier 114 may be rotated at about 2 RPM to about 100 RPM, such as at about 30 RPM. Rotating the substrate carrier 114 aids in providing uniform heating of the substrates 140 and uniform exposure of the processing gases to each substrate 140. During processing, the distance between the lower surface of showerhead assembly 104 and the substrate carrier 114 ranges from about 4 mm to about 41 mm. The lower surface of showerhead assembly 104 is coplanar and faces the substrates 140 during processing.

The substrate carrier 114 is shown having two substrates 140 positioned within recesses 116. However, substrate carrier 114 may support six, eight, or more substrates during processing depending on the desired throughput. Typical substrates 140 may include sapphire, silicon carbide, or silicon. It is contemplated that other types of substrates 140, such as glass substrates 140, may also be processed. Substrate 140 size may range from 50 mm-150 mm in diameter or larger. It is to be understood that substrates 140 of other sizes may be processed within the chamber 102 and according to the processes described herein.

A gas delivery system 125 is coupled to the showerhead apparatus 104 to provide one or more gases to the processing region 108 during processing. The gas delivery system 125 includes multiple gas sources 131A and 132A coupled to supply lines 131 and 132, respectively, as well as supply line 133. It is to be understood that the gas delivery system 125 is not limited to two gas sources. Each supply line 131, 132 may comprise a plurality of lines which are coupled to and in fluid communication with the showerhead assembly 104. Depending on the process being run, some of the sources may be liquid sources rather than gases, in which case the gas delivery system may include a liquid injection system or other means (e.g., a bubbler) to vaporize the liquid. The vapor may then be mixed with a carrier gas such as hydrogen ($H_2$), nitrogen ($N_2$), helium (He) or argon (Ar) prior to delivery to the chamber 102. Different gases, such as precursor gases, carrier gases, purge gases, cleaning/etching gases or others may be supplied from the gas delivery system 125 to separate supply lines 131, 132, and 133 to the showerhead assembly 104. Furthermore, the supply lines 131, 132, and 133 may include shut-off valves and mass flow controllers or other types of controllers to monitor and regulate or shut off the flow of gas in each line.

A conduit 129 receives cleaning and/or etching gases from a remote plasma source 126. The remote plasma source 126 receives gases from the gas delivery system 125 via supply line 124. A valve 130 is disposed between the showerhead assembly 104 and remote plasma source 126 to control the flow of gas between the remote plasma source 126 and the showerhead assembly 104. The valve 130 may be opened to allow a cleaning and/or etching gas, including ionized gases, to flow into the showerhead assembly 104 via supply line 133. Additionally, the gas delivery system 125 and remote plasma source 126 may be suitably adapted so that process gases from sources 131A and 132A may be supplied to the remote plasma source 126 to produce plasma species which may be sent through showerhead assembly 104 to deposit CVD layers, such as III-V films, on substrates 140.

The remote plasma source 126 is a radio frequency plasma source adapted for chamber cleaning and/or substrate etching. Cleaning and/or etching gas may be supplied to the remote plasma source 126 via supply line 124 to produce plasma species which may be sent via conduit 129 and supply line 133 for dispersion through showerhead assembly 104 into chamber 102. Alternatively, cleaning/ etching gases may be delivered from gas delivery system 125 for non-plasma cleaning and/or etching using alternate supply line configurations to showerhead assembly 104. Gases for a cleaning application may comprise a halogen containing gas, such as fluorine or chlorine, or vapor comprising hydrochloric acid (HCl). It is contemplated that plasma sources other than radio frequency plasma sources, for example microwave plasma sources, may also be used.

A purge gas (e.g., nitrogen) may be delivered into the chamber 102 from the showerhead assembly 104 and/or from inlet ports (not shown) disposed below the substrate carrier 114 near the bottom of the chamber body 103. The purge gas may be used to remove gases from the processing region 108 after processing. In additional to purging the chamber 102, gas provided from inlet ports disposed below the substrate carrier 114 may also increase the pressure within the lower volume 110 to contain process gases in the processing region 108, thereby reducing the deposition of material in undesired locations. The purge gas enters the lower volume 110 of the chamber 102 and flows upwards past the substrate carrier 114 and exhaust ring 120 and into multiple exhaust ports 109 which are disposed around an annular exhaust channel 105. An exhaust conduit 106 connects the annular exhaust channel 105 to a vacuum system 112 which includes a vacuum pump (not shown). The chamber pressure may be controlled using a valve system 107 which controls the rate at which the exhaust gases are drawn from the annular exhaust channel 105. During processing, the draw of the annular exhaust channel 105 may affect gas flow so that the process gas introduced to the processing region 108 flows substantially tangential to the substrates 140 and may be uniformly distributed radially across the substrate 140 deposition surfaces in a laminar flow. The processing region 108 may be maintained at a pressure of about 760 Torr down to about 80 Torr during processing.

The showerhead assembly 104 has a heat exchanging system 170 coupled thereto to assist in controlling the temperature of various components of the showerhead assembly 170. The heat exchanging system 170 comprises a heat exchanger 170A that is coupled to the showerhead assembly 104 via an inlet conduit 171 and an outlet conduit 172. A controller 199 is coupled to the heat exchanger 170A to control the temperature of the showerhead assembly 104.

Figure 2:
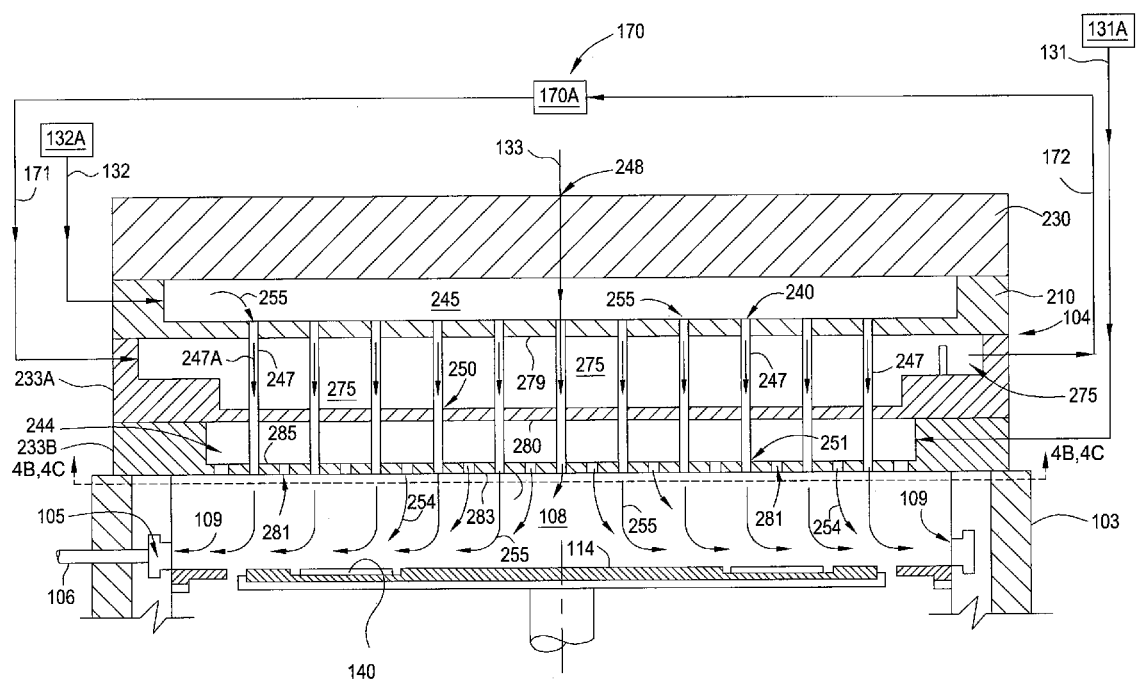
FIG. 2 is a cross sectional view of an embodiment of a showerhead assembly.

FIG. 2 is a cross sectional view of an embodiment of a showerhead assembly. The showerhead assembly 104 comprises a top plate 230, mid-plate 210, an upper bottom plate 233A and a lower bottom plate 233B. The upper bottom plate 233A and the lower bottom plate 233B define the first plenum 244. The mid-plate 210 and upper bottom plate 233A define the heat exchanging channel 275. The top plate 230 and the mid-plate 210 define the second plenum 245.

The heat exchanging channel 275 is coupled to a heat exchanging system 170 to control the temperature of the various surfaces of the showerhead assembly 104. The heat exchanging system 170 comprises a heat exchanger 170A that is coupled to the one or more heat exchanging channels 275 formed in the showerhead assembly 104 via an inlet conduit 171 and an outlet conduit 172. The heat exchanging channel 275 through which a heat exchanging fluid flows is used to help regulate the temperature of the showerhead assembly 104.

The heat exchanging channel 275 is disposed between the first plenum 244 and the second plenum 245. The heat exchanging channel 275 encircles the first gas conduits 247, which are disposed through mid-plate holes 240, bottom plate holes 250 and holes 251 in wall 285. Thus, the heat exchanging fluid can flow around and cool the gas or vapor flowing through a central region 247A of the first gas conduits 247 while the vapor flows into processing region 108. The central region 247A of the first gas conduits 247 are in fluid communication with the second plenum 245 and the processing region 108, thus permitting process gases to travel from the second plenum 245 to the processing region 108. In this configuration, the heat exchanging channel 275 is disposed between the first plenum 244 and second plenum 245 to control the temperature of the gases or vapor delivered therethrough.

A central conduit 248 is disposed through the showerhead assembly 104 to provide a cleaning and/or etching gas or plasma into the chamber body 103. The central conduit 248 may receive cleaning and/or etching gas or plasma from supply line 133 and disperse the cleaning and/or etching gas inside chamber body 103 to provide more effective cleaning. Alternatively, cleaning and/or etching gas or plasma may be delivered into chamber body 103 through other routes, such as through the first gas conduits 247 and/or the second gas conduits 281 in the showerhead assembly 104. For plasma based etching or cleaning, fluorine or chlorine may be used. For non-plasma based etching, halogen gases, such as $Cl_2$, Br, and $I_2$, or halides, such as HCl, HBr, and HI may be used. The cleaning and/or etching gas is removed from the processing region 108 through the exhaust port 109, the exhaust channel 105, and the exhaust conduit 106.

The process gas 255 flows from the gas supply 132A through supply line 132 into the second plenum 245 and into the first gas conduits 247, which are in fluid communication with the processing region 108. The process gas 254 flows from gas supply 131A through the supply line 131 into the second gas conduits 281 towards the processing region 108. The first plenum 244 is not in fluid communication with the second plenum 245 so that the first process gas 254 and the second process gas 255 remain isolated until injected into the processing region 108 located within the chamber body 103. The process gas 254 and/or process gas 255 may comprise one or more precursor gases or other process gases, including carrier gases and dopant gases, to carry out desired processes within the processing region 108. For example, process gas 254 and process gas 255 may contain one or more precursors for deposition of a material on substrates 140 positioned on substrate carrier 114.

The positioning of a heat exchanging channel 275 provides control of the temperature of various showerhead assembly features, such as the first gas conduits 247, the wall 280, and the showerhead face 283. Control of the temperature of the showerhead assembly features is desirable to reduce or eliminate the formation of condensates on the showerhead assembly 104. Control of the temperature of the various showerhead assembly features is also desirable to reduce gas phase particle formation and to prevent the production of undesirable precursor reactant products which may adversely affect the composition of the film deposited on the substrates 140. The showerhead temperature may be measured by one or more thermocouples or other temperature sensors disposed in proximity to showerhead face 283, heat exchanging channel 275, and/or wall 280. Additionally or alternatively, one or more thermocouples or other temperature sensors may be disposed in proximity to the inlet conduit 171 and/or the outlet conduit 172. The temperature data measured by the one or more thermocouples or other temperature sensors is sent to a controller which may adjust the heat exchanging fluid temperature and flow rate to maintain the showerhead temperature within a predetermined range. The showerhead temperature is generally maintained at about 50 degrees Celsius to about 350 degrees Celsius, but may also be maintained at a temperature of greater than 350 degrees Celsius, if desired.

It is believed that a gas conduit and heat exchanging channel configuration that only requires half of the gas conduits (e.g., the first gas conduits 247) to extend through the heat exchanging channel 275 will greatly reduce the chances of the heat exchanging fluid leaking into the first plenum 244 or second plenum 245 at the junctions formed between the gas conduits (e.g., the first gas conduits 247) and the walls (e.g., walls 279 and 280). Only half of the gas conduits are required to extend through the heat exchanging channel 275, since only one gas plenum (e.g., second plenum 245) is disposed on one side of the heat exchanging channel 275 opposite the processing region 108, while the gas exiting the first plenum 244 enters directly into the processing region 108. Also, by positioning the heat exchanging channel 275 so that it is not directly adjacent to the processing region 108, the chances that a heat exchanging fluid leak will reach the processing region 108 is greatly reduced. Thus, the chance of damage occurring to the chamber and substrates 140 is also reduced. It is also believed that the leakage of the heat exchanging fluid into the processing region 108 can be dangerous at the typical processing temperature used to form LED and LD products, such as greater than 750 degrees Celsius, due to the phase change created as the liquid heat exchanging fluid turns into a gas.

The flow rate of the heat exchanging fluid may be adjusted to help control the temperature of the showerhead assembly 104. Additionally, the thickness of the walls 279 and 280 surrounding the heat exchanging channel 275 may be designed to facilitate temperature regulation of various showerhead surfaces. Suitable heat exchanging fluids include water, water-based ethylene glycol mixtures, a perfluoropolyether (e.g., GALDEN® fluid), oil-based thermal transfer fluids, or liquid metals such as gallium or gallium alloy. The heat exchanging fluid is circulated through a heat exchanger 170A to raise or lower the temperature of the heat exchanging fluid as required to maintain the temperature of the showerhead assembly 104 within a desired temperature range. The heat exchanging fluid can be maintained at a temperature of 20 degrees Celsius or greater, depending on process requirements. For example, the heat exchanging fluid can be maintained at a temperature within a range from about 20 degrees Celsius to about 120 degrees, or within a range of about 100 degrees Celsius to about 350 degrees Celsius. The heat exchanging fluid may also be heated above its boiling point so that the showerhead assembly 104 may be maintained at higher temperatures using readily available heat exchanging fluids.

Figure 3:
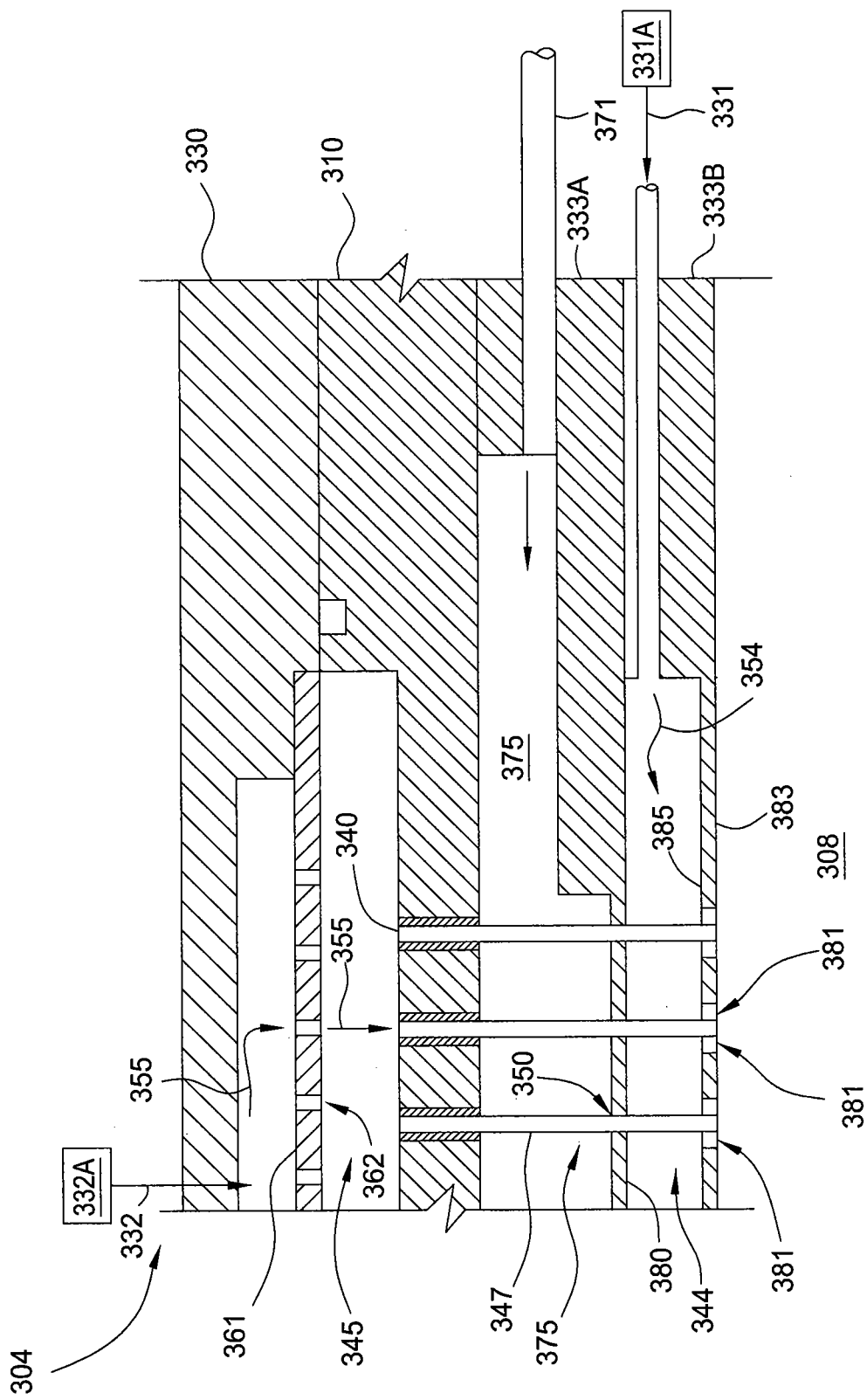
FIG. 3 is a partial cross sectional view of another embodiment of a showerhead assembly.

FIG. 3 is a partial cross sectional view of another embodiment of a showerhead assembly. The showerhead assembly 304 comprises a top plate 330, mid-plate 310, an upper bottom plate 333A and a lower bottom plate 333B which are coupled together. The mid-plate 310 and upper bottom plate 333A define the heat exchanging channel 375 through which the second gas conduits 347 extend.

The mid-plate 310 includes a plurality of second gas conduits 347 disposed therethrough. The plurality of second gas conduits 347 are disposed in the mid-plate holes 340 and extend down through heat exchanging channel 375 and into the bottom plate holes 350 located in upper bottom plate 333A. The second gas conduits 347, which are aluminum tubes, are sealably coupled to the mid-plate 310 and wall 380 in the upper bottom plate 333A by use of a brazing or a welding technique to prevent the heat exchanging fluid from entering the first plenum 344 or the second plenum 345. The second gas conduits 347 are sealably coupled to the mid-plate 310, wall 380 and wall 385 to assure that the fluids flowing through the first plenum 344, second plenum 345 and heat exchanging channel 375 are all isolated from each other. The first plenum 344 is fluidly coupled to the processing region 308 through the first gas conduits 381 formed in the wall 385 of the lower bottom plate 333B. The upper bottom plate 333A and a lower plate 333B are sealably coupled together to form the first plenum 344, and to prevent the material delivered from the source 331A from leaking from regions of the showerhead assembly 304. Alternatively, the upper plate 333A and lower plate 333B may be a single, unitary plate.

The top plate 330, the mid-plate 310, upper bottom plate 333A and lower bottom plate 333B are formed from a metal, such as 316L stainless steel. It is contemplated that the top plate 330, the mid-plate 310, upper bottom plate 333A and lower bottom plate 333B may be formed from other materials as well, such as INCONEL®, HASTELLOY®, electroless nickel plated aluminum, pure nickel, and other metals and alloys resistant to chemical attack, or even quartz. Additionally, it is contemplated that the second gas conduits 347 may be formed from a material other than aluminum, such as stainless steel.

The top plate 330 contains a blocker plate 361 that is adapted to evenly distribute the flow of the process gas 355 before the process gas 355 enters the second plenum 345. In this configuration, the process gas 355 is delivered to second plenum 345 from the source 332A via gas line 332 and holes 362 formed in the blocker plate 361. The process gas 355 then flows into a plurality of mid-plate holes 340 disposed in mid-plate 310 and into the second gas conduits 347, which are in fluid communication with the processing region 308.

Each of the first gas conduits 381 are concentric with the outlet of the second gas conduits 347. In one example, the second gas conduits 347 and first gas conduits 381 are both cylindrical in shape. A first end of each second gas conduit 347 is disposed in a mid-plate hole 340 and the first end of the second gas conduit 347 is suitably coupled (e.g., brazed, welded and/or press fit) to mid-plate 310 so that a fluid seal is formed between the second gas conduit 347 and mid-plate 310. Further, a second portion of each second gas conduit 347 is disposed within plate hole 350 of the upper bottom plate 333A such that the second gas conduit 347 is sealably connected (e.g., brazed, welded and/or press fit) to the wall 380 of the upper bottom plate 333A. The first plenum 344 contains first process gas 354 which flows out of a plurality of first conduits 381 and into the processing region 108.

Figure 4C:
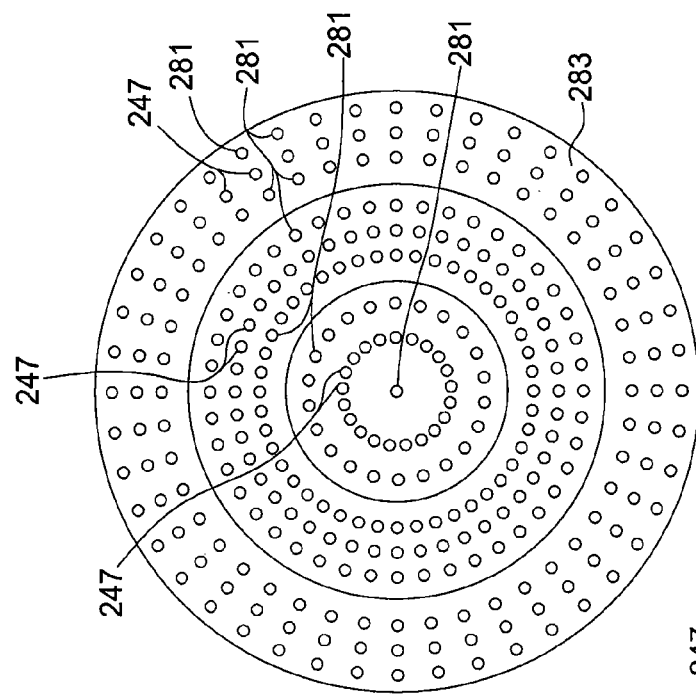
FIG. 4C is a partial schematic bottom view of the showerhead assembly shown in FIG. 2 according to an embodiment of the invention.
Figure 4A:
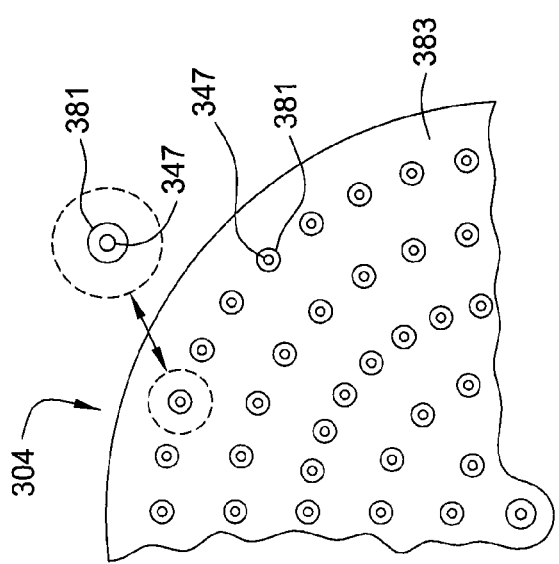
FIG. 4A is a partial schematic bottom view of the showerhead assembly shown in FIG. 3 according to an embodiment of the invention.
Figure 4B:
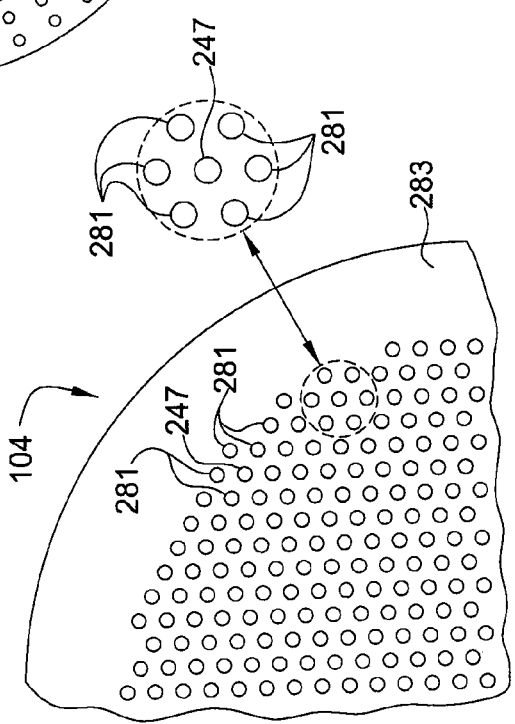
FIG. 4B is a partial schematic bottom view of the showerhead assembly shown in FIG. 2 according to an embodiment of the invention.

FIGS. 4A, 4B and 4C are schematic bottom views of the showerhead assemblies shown in FIG. 2 and FIG. 3 according to embodiments of the present invention. FIG. 4A is a partial schematic bottom view of the showerhead assembly shown in FIG. 3. In this configuration of showerhead assembly 304, an array of concentric gas conduits (i.e., gas conduit 347 and gas conduits 381) are formed in the showerhead face 383 to evenly distribute and mix the process gas prior to delivery to the surface of a substrate.

FIG. 4B is a partial schematic bottom view of the showerhead assembly shown in FIG. 2 according to one embodiment of the invention. In this configuration of showerhead assembly 104, an array of gas conduits 247 and gas conduits 281 are formed in the showerhead face 283 to evenly distribute and mix the process prior to delivery to the surface of a substrate. In this configuration, the gas conduits 247 and gas conduits 281 are adjacently configured in a hexagonal close pack orientation.

FIG. 4C is a partial schematic bottom view of the showerhead assembly shown in FIG. 2 according to another embodiment of the invention. In this configuration a radial array of gas conduits 247 and gas conduits 281 are formed in the showerhead face 283 to evenly distribute and mix the process gas prior to delivery to the surface of a substrate. In this configuration, the radial array comprises an interleaved circular array of gas conduits 247 and gas conduits 281 that are concentric about the center of the showerhead assembly. The embodiments shown in FIGS. 4A, 4B and 4C are not meant to be limiting in scope, but rather, illustrate some of the possible combinations of gas conduits 247, 281, 347 and 381.

The showerhead assembly described herein may be advantageously used in substrate processing, especially metal organic chemical vapor depositions or hydride vapor phase epitaxy processes. With reference to FIG. 3, a metal organic vapor deposition process will be described. In the metal organic chemical vapor deposition process, a process gas 354 at a first temperature is introduced to a first plenum 344 of the showerhead apparatus 304. The process gas 354 is then flown into a processing region 308. A process gas 355 at a second temperature is introduced to a second plenum 345 of the showerhead apparatus 304. The process gas 355 is then flown into the processing region 308 through gas conduits 347. A heat exchanging fluid is introduced to a heat exchanging channel 375 disposed between the first plenum 344 and the second plenum 345. The process gas 354 and the process gas 355 are reacted in the processing region 108 to form a film on a substrate. It is to be understood that process gas 354 and process gas 355 may be flown sequentially or simultaneously. Additionally, it is to be understood that the heat exchanging fluid may be introduced to the heat exchanging channel prior to, during, or after flowing the process gases 354, 355 to the processing region.

The process gas 354 which is delivered to first plenum 344 may comprise a Group V precursor, and process gas 355 which is delivered to second plenum 345 may comprise a Group III precursor. Alternatively, the precursor delivery may be switched so that the Group V precursor is routed to second plenum 345 and the Group III precursor is routed to first plenum 344. The choice of first or second plenum 344, 345 for a given precursor may be determined in part by the distance of the plenum from the heat exchanging channel 375 and the desired temperature ranges which may be maintained for each plenum and the precursor therein. Thus, examples of processes gases provided to the first plenum 344 or second plenum 345 are not meant to be limiting in scope, rather, the examples are provided merely for explanatory purposes. It is to be understood that embodiments described herein are not to be restricted to certain processes gases provided to either the first plenum 344 or second plenum 345 without specific recitation.

Gas source 332A is configured to deliver a process gas 355 to the first plenum 345. Process gas 355 is a metal organic precursor, such as gallium chloride. Other metal organic precursors, including Group III precursors such as trimethylgallium (TMG), trimethyl aluminum (TMAI) and trimethyl indium (TMI), are contemplated. Group III precursors having the general formula $MX_3$ may also be used, where M is a Group III element (e.g., gallium, aluminum, or indium) and X is a Group VII element (e.g., bromine, chlorine or iodine). Source 331A is configured to deliver a process gas 354, such as ammonia, to the second plenum 344. It is contemplated that other process gasses, such as nitrogen ($N_2$) or hydrogen ($H_2$) may be used.

Process gas 354 and process gas 355 are reacted to deposit a material, such as gallium nitride, on a substrate. It is contemplated that other materials may also be deposited on a substrate, such as aluminum nitride, indium nitride, aluminum gallium nitride and indium gallium nitride. Additionally, dopants, such as silicon (Si) or magnesium (Mg), may be added to the films. The films may be doped by adding small amounts of dopant gases during the deposition process. For silicon doping, silane ($SiH_4$) or disilane ($Si_2H_6$) gases may be used, for example, and a dopant gas may include Bis(cyclopentadienyl) magnesium ($Cp_2Mg$ or $(C_5H_5)_2Mg$) for magnesium doping.

The deposition of material on a substrate generally occurs at temperatures greater than about 20 degrees Celsius. Thus, it may be desirable to heat the process gases prior to deposition so that lamps or resistive heaters are not the sole means of providing heat. This allows for more control over deposition temperatures, resulting in a more uniform deposition. However, some process gases cannot always be heated to a desired temperature prior to material deposition because the precursor contained within the process gas could decompose. If the precursor undesirably decomposes, deposition of material could occur in locations other than a substrate surface, for example, on interior surfaces of the showerhead assembly 304. Deposition within the showerhead assembly 304 can affect gas flow, or could flake off, which could therefore affect deposition uniformity of a material on a substrate. Thus, deposition of a material on interior surfaces of the showerhead assembly 304 is undesirable.

One advantage of positioning heat exchanging channel 375 between the first plenum 344 and the second plenum 345 is the ability to deliver multiple precursors to the processing region 308 at different temperatures. Since the heat exchanging channel 375 is positioned between the first plenum 344 and the second plenum 345, only one precursor travels across the heat exchanging channel 375. Thus, precursor temperatures can be desirably affected by heat exchanging fluid provided to the heat exchanging channel 375 through inlet conduit 371. For example, source 331A may contain a Group V precursor and may be heated in supply line 331 while being delivered to the showerhead assembly 304. The process gas then enters the first plenum 344 and the processing region 308 without crossing the heat exchanging channel 375. Thus, the temperature of the Group V precursor remains substantially at the elevated temperature caused by the heated supply lines. Additionally or alternatively, the temperature of the process gas in the first plenum 344 could be increased by heat radiated from the processing region 308, thus pre-heating the process gas before delivery to the process region. Heating of the process gas allows a reaction to occur at an elevated temperature without requiring lamps disposed below the chamber to be the sole method of heating the interior of the chamber.

In one example, a Group III precursor, such as trimethylgallium is delivered to the second plenum 345 at a first temperature. Since trimethylgallium can decompose at elevated temperatures, thus depositing gallium on interior surfaces of the showerhead assembly 304, it is preferable that the first temperature is sufficiently low to prevent gallium deposition. The trimethylgallium is then introduced to the processing region 308 through gas conduits 347. Since gas conduits 347 are positioned in contact with a heat exchanging fluid present in the heat exchanging channel 375, the temperature of the trimethylgallium present in the gas conduits 347 is prevented from increasing to a temperature where decomposition and deposition could occur. A Group V precursor, such as ammonia, is delivered to the processing region 308 through the first plenum 344 at a second temperature which is greater than the first temperature. Since the Group V precursor does not pass through the heat exchanging channel 375, the Group V precursor enters the processing region 308 without a substantial loss of heat. Thus, the Group V precursor enters the processing region 308 at the second temperature, while the Group II precursor enters the processing region at the first temperature (as maintained by the heat exchanging fluid). Thus, by positioning a heat exchanging channel 375 between a first plenum 344 and a second plenum 345, temperature-sensitive precursors can be delivered to the process region 308 without decomposing in undesired locations. Furthermore, precursors which are not temperature sensitive can be delivered at increased temperatures to allow more control over deposition processes by providing an additional means of controlling process gas temperatures.

Additionally, since process gas temperatures can be affected by heated gas lines, heat exchanging fluid, and lamps disposed beneath the chamber, the temperature of the process gases and of the substrate during processing can be more accurately controlled and fine-tuned. The combination of multiple heating sources allows for greater process control and thus deposition uniformity. Also, by disposing heat exchanging channel 375 within the showerhead assembly 304, the temperature of the showerhead assembly 304 can be maintained by removing any excess heat transferred to the showerhead assembly 304 from the heated Group V precursor. Thus, heat-induced damage, such as warping or wear of the showerhead, can be prevented. Additionally, since a heated process gas does not travel through the heat exchanging channel 375, thermal efficiency is increased. If a heated gas was to pass through the heat exchanging channel 375, heat would be removed. Thus, lamps would have to reheat the process gas by providing heat to the interior of the chamber which was previously removed by the heat exchanging fluid, thereby reducing thermal budget and increasing process cost.

The showerhead assembly embodiments described herein for metal organic chemical vapor deposition applications may be adapted for use in a hydride vapor phase epitaxy or metal-organic chemical vapor deposition, among other processes. The hydride vapor phase epitaxy process offers several advantages in the growth of some Group III-IV films, gallium nitride in particular, such as high growth rate, relative simplicity, and cost effectiveness. In this technique, the growth of gallium nitride proceeds due to the high temperature, vapor phase reaction between gallium chloride and ammonia. The ammonia may be supplied from a standard gas source, while the gallium chloride is produced by passing a hydride-containing gas, such as HCl, over a heated liquid gallium supply. The two gases, ammonia and gallium chloride, are directed towards a heated substrate where they react to form an epitaxial gallium nitride film on the surface of the substrate. In general, the hydride vapor phase epitaxy process may be used to grow other Group III-nitride films by flowing a hydride-containing gas (such as HCl, HBr, or HI) over a Group III liquid source to form a Group III-halide gas. Then, the Group III-halide gas is mixed with a nitrogen-containing gas, such as ammonia, to form a Group III-nitride film.

Still with reference to FIG. 3, when showerhead assembly 304 is adapted for hydride vapor phase epitaxy, a heated source boat (not shown) may be coupled to the first plenum 344 or the second plenum 345. The heated source boat may contain a metal (e.g., gallium) source which is heated to the liquid phase, and a hydride-containing gas (e.g., hydrochloric acid) may flow over the metal source to form a Group III-halide gas, such as gallium chloride. The Group III-halide gas and a nitrogen-containing gas, such as ammonia, may then be delivered to first and second plenums 344, 345 of showerhead assembly 304 via supply lines 331, 332 for injection into the processing region 308 to deposit a Group III-nitride film, such as gallium nitride, on a substrate. Additionally or alternatively, one or more supply lines 331, 332 may be heated to deliver the precursors from an external heated boat to chamber 302. Also, an inert gas, which may be hydrogen, nitrogen, helium, argon or combinations thereof, may be flowed between first and second hydride vapor phase epitaxy process gases to help keep the precursors separated before reaching a substrate. The HVPE process gases may also include dopant gases.

Nom Advantages of the present invention include, but are not limited to, an improved deposition apparatus and processes which provide greater process control and uniformity. A heat exchanging channel disposed within a showerhead assembly allows for temperature control of the showerhead assembly, and may increase the usable life of the showerhead assembly by reducing heat-induced damage thereto. Additionally, since at least one process gas is not required to travel across or through the heat exchanging channel, one process gas can be delivered to a processing region at a temperature greater than another processing gas. This allows for process gases to be supplied to a process region at a more accurate temperature. Additionally, since the process gas does not undesirably have heat removed, the overall thermal budget of the process is decreased because lamps below the chamber are not required to supply energy to the process gas or chamber which was previously removed by a heat exchanging fluid. Thus, since at least one process gas does not travel through the heat exchanging channel, processes within the process chamber are thermally more efficient.

Furthermore, since the invention provides at least two ways of controlling process temperature (accurate heating of process gas prior to delivery to the showerhead apparatus, and heat supplied from lamps disposed below the chamber), processes within the chamber can be more accurately controlled. The greater level of control due to the multiple heat sources causes greater process uniformity across individual substrates, and greater uniformity from substrate to substrate during processing. Thus, since substrate uniformity is increased, a greater number of substrates and/or larger substrates can be processed compared to traditional metal organic chemical vapor deposition chambers. The increased processing ability increases throughput and reduces processing cost per substrate.

While the foregoing is directed to embodiments of the present invention, other and further embodiments of the invention may be devised without departing from the basic scope thereof, and the scope thereof is determined by the claims that follow.

I claim:

1. An apparatus, comprising:
  a lower bottom plate;
  an upper bottom plate positioned above the lower bottom plate, the upper bottom plate and the lower bottom plate defining a first plenum;
  a plurality of first gas conduits in fluid communication with the first plenum and a processing region of a process chamber;
  a mid-plate positioned above the upper bottom plate, the mid-plate and the upper bottom plate defining a heat exchanging channel for containing a heat exchanging fluid;
  a top plate positioned above the mid-plate, the top plate and the mid-plate defining a second plenum; and
  a plurality of second gas conduits in fluid communication with the second plenum and the processing region, the plurality of second gas conduits extending through the first plenum and the heat exchanging channel, and each of the first gas conduits enclosing one of the second gas conduits.

2. The apparatus of claim 1, wherein each of the first gas conduits encloses one of the second gas conduits that is concentrically arranged therewith.

3. The apparatus of claim 1, wherein the plurality of first and second gas conduits have a cylindrical configuration.

4. The apparatus of claim 1, wherein the top plate includes a blocker plate positioned above the second plenum.

5. The apparatus of claim 4, wherein the mid-plate and the upper bottom plate both have holes disposed therethrough, and wherein the plurality of second gas conduits are positioned within the holes of the mid-plate and the upper bottom plate.

6. The apparatus of claim 5, wherein the top plate, the mid-plate, the upper bottom plate and the lower bottom plate comprise stainless steel, aluminum or nickel.

7. The apparatus of claim 6, wherein the second gas conduits comprise aluminum.

8. An apparatus, comprising:
  a lower bottom plate;
  an upper bottom plate positioned above the lower bottom plate, the upper bottom plate and the lower bottom plate defining a first plenum;
  a mid-plate positioned above the upper bottom plate, the mid-plate and the upper bottom plate defining a heat exchanging channel for containing a heat exchanging fluid;
  a top plate positioned above the mid-plate, the top plate and the mid-plate defining a second plenum; and
  a plurality of first gas conduits in fluid communication with the second plenum and the processing region, the plurality of first gas conduits extending through the first plenum and the heat exchanging channel.

9. The apparatus of claim 8, wherein the top plate, the mid-plate, the upper bottom plate, the lower bottom plate and the plurality of first gas conduits comprise stainless steel.

10. The apparatus of claim 9, wherein the mid-plate and the upper bottom plate both have holes disposed therethrough, and wherein the plurality of first gas conduits are positioned within the holes of the mid-plate and the upper bottom plate.

11. The apparatus of claim 10, further comprising a plurality of second gas conduits, wherein the first gas conduits and the second gas conduits are positioned in a hexagonal close pack orientation on a surface of the lower bottom plate.

12. The apparatus of claim 10, further comprising a plurality of second gas conduits, wherein the first gas conduits and the second gas conduits form concentric circular arrays on a surface of the lower bottom plate.

* * * * *

UNITED STATES PATENT AND TRADEMARK OFFICE
CERTIFICATE OF CORRECTION

PATENT NO.        : 9,449,859 B2
APPLICATION NO.   : 13/500948
DATED             : September 20, 2016
INVENTOR(S)       : Eddy J. Song It is certified that error appears in the above-identified patent and that said Letters Patent is hereby corrected as shown below:

On the title page, in item (75), in column 1, in "Inventor", line 1, delete "Mountain View, CA" and insert -- Los Altos, CA --, therefor.

Specification

In column 12, line 50, delete "Group III-IV" and insert -- Group III-V --, therefor.

In column 13, line 22, before "Advantages" delete "Nom".

Signed and Sealed this
Thirteenth Day of December, 2016

Michelle K. Lee
*Director of the United States Patent and Trademark Office*